(12) United States Patent
Fukami et al.

(10) Patent No.: US 10,143,120 B2
(45) Date of Patent: Nov. 27, 2018

(54) COMPONENT MOUNTER

(71) Applicant: Panasonic Intellectual Property Management Co., Ltd., Osaka (JP)

(72) Inventors: Takaki Fukami, Osaka (JP); Hideaki Ohno, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 41 days.

(21) Appl. No.: 15/271,202

(22) Filed: Sep. 20, 2016

(65) Prior Publication Data

US 2017/0105323 A1 Apr. 13, 2017

(30) Foreign Application Priority Data

Oct. 8, 2015 (JP) .................................. 2015-199836

(51) Int. Cl.
*H05K 13/04* (2006.01)

(52) U.S. Cl.
CPC ..... *H05K 13/0408* (2013.01); *H05K 13/0413* (2013.01)

(58) Field of Classification Search
CPC .................................................. B25J 15/0616
USPC ................................................... 294/183, 65
See application file for complete search history.

(56) References Cited

U.S. PATENT DOCUMENTS

| | | | | |
|---|---|---|---|---|
| 4,079,913 A | * | 3/1978 | Popp | F16K 31/0624 |
| | | | | 137/627.5 |
| 6,161,443 A | * | 12/2000 | Biesecker | H05K 13/0404 |
| | | | | 29/741 |
| 2014/0112748 A1 | * | 4/2014 | Doll | E02F 3/46 |
| | | | | 414/685 |

FOREIGN PATENT DOCUMENTS

JP    2007-294825    11/2007

* cited by examiner

*Primary Examiner* — Ronald P Jarrett
(74) *Attorney, Agent, or Firm* — Pearne & Gordon LLP

(57) ABSTRACT

A component mounter is provided with a nozzle shaft holder which includes a through-hole into which a nozzle shaft, a component suction nozzle being installed on the bottom end thereof, is inserted, and bearings which are disposed in two locations separated vertically on an inner circumferential surface of the through-hole and which guide the nozzle shaft in the vertical direction. In the bearings, two ring-shaped guide portions which surround an outer circumferential surface of the nozzle shaft are formed separated in a vertical direction, a grease holder, which has a larger inner diameter than the ring-shaped guide portions, is formed between the two ring-shaped guide portions, and a space surrounded by the outer circumferential surface of the nozzle shaft, the two ring-shaped guide portions, and the grease holder is filled with grease.

6 Claims, 7 Drawing Sheets

1 COMPONENT MOUNTER

12 NOZZLE SHAFT HOLDER
16 NOZZLE SHAFT
19 COMPONENT SUCTION NOZZLE
24 COMPONENT SUCTION NOZZLE LIFTING AND LOWERING MECHANISM

15a INNER CIRCUMFERENTIAL SURFACE
16a OUTER CIRCUMFERENTIAL SURFACE
17a RING-SHAPED GUIDE PORTION
17b: GREASE HOLDER
17d: ELASTIC RING
G: GREASE
P1: FIRST FLOW PATH

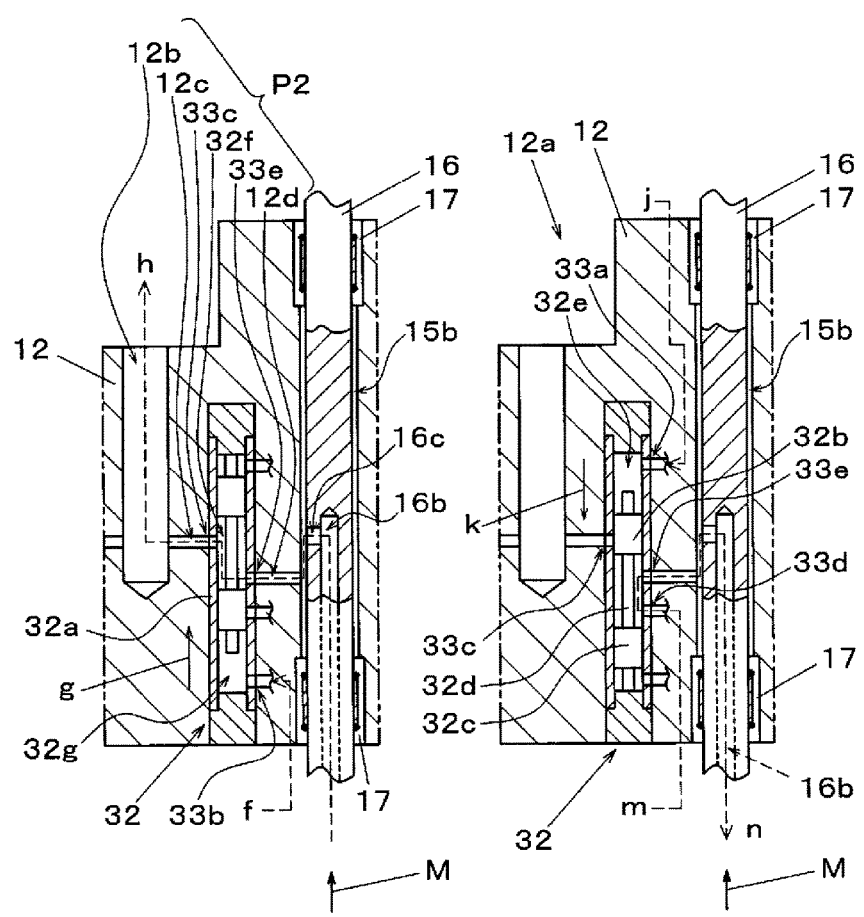
P2 SECOND FLOW PATH

COMPONENT MOUNTER

BACKGROUND

1. Technical Field

The present disclosure relates to a component mounter which is provided with a component suction nozzle which uses a suction force, which is generated by a negative pressure generation source, to hold a component.

2. Description of the Related Art

The component mounter which mounts components onto a board uses a placing head which is provided with the component suction nozzle which uses a suction force, which is generated by a negative pressure generation source, to hold a component, to pick up the component from a component supplier, transport the component to the board, and mount the component onto the board. A rotary system multi-nozzle head in which a plurality of nozzle shafts are disposed inserted into a corresponding plurality of through-holes which are provided at an equal interval in a rotating member (a nozzle shaft holder) which performs index rotation is known as an example of the placing head (for example, refer to PTL 1). Component suction nozzles are installed on the bottom ends of the plurality of nozzle shafts.

In the placing head described in PTL 1, the top and the bottom of each of the through-holes of the rotating member are each provided with a retaining member formed of an elastic body such as fluorine-based rubber. The nozzle shaft which is inserted into the through-hole is supported by an elastic force which is generated due to the retaining member which contacts the outer circumferential portion of the nozzle shaft deforming. In this state, the component suction nozzle which is installed on the nozzle shaft is lifted and lowered due to vertical movement of the nozzle shaft inside the through-hole.

CITATION LIST

Patent Literature

PTL 1: Japanese Patent Unexamined Publication No. 2007-294825

SUMMARY

A component mounter of the present disclosure is provided with a component suction nozzle which uses a suction force which is generated by a negative pressure generation source to hold a component, and the component mounter includes a nozzle shaft, on a bottom end of which the component suction nozzle is installed, a nozzle shaft holder which includes a through-hole into which the nozzle shaft is inserted, two bearings which are disposed in two locations separated vertically on an inner circumferential surface of the through-hole and which guide the nozzle shaft in a vertical direction, a first flow path which is an air flow path formed inside the nozzle shaft, one end of the first flow path is an outer circumferential surface of the nozzle shaft and is open at a position interposed by the two bearings, and another end communicates with the component suction nozzle which is installed on a bottom end of the nozzle shaft, a second flow path which is an air flow path formed inside the nozzle shaft holder, one end of the second flow path communicates with the negative pressure generation source, and another end is an inner circumferential surface of the through-hole and is open at a position which is interposed between the two bearings, and a component suction nozzle lifting and lowering mechanism which causes the nozzle shaft to move vertically in relation to the nozzle shaft holder, in which, in the bearings, two ring-shaped guide portions which surround an outer circumferential surface of the nozzle shaft to guide the nozzle shaft in the vertical direction are formed separated in the vertical direction, a grease holder which has a larger inner diameter than the ring-shaped guide portion is formed between the two ring-shaped guide portions, and a space which is surrounded by the outer circumferential surface of the nozzle shaft, the two ring-shaped guide portions, and the grease holder is filled with grease.

Another component mounter of the present disclosure is provided with a component suction nozzle which uses a suction force which is generated by a negative pressure generation source to hold a component, and the component mounter includes a plurality of nozzle shafts, on a bottom end of each of which the component suction nozzle is installed, a nozzle shaft holder which includes a plurality of through-holes and holds the nozzle shafts in a state in which one nozzle shaft is inserted into each of the through-holes, two bearings which are disposed in two locations separated vertically on an inner circumferential surface of the through-hole and which guide the nozzle shaft in a vertical direction, first flow paths which are air flow paths formed inside each of the nozzle shafts, one end of the first flow path is an outer circumferential surface of the nozzle shaft and is open at a position interposed by the two bearings, and another end communicates with the component suction nozzle which is installed on a bottom end of the nozzle shaft, a second flow path which is an air flow path formed inside the nozzle shaft holder, one end of the second flow path communicates with the negative pressure generation source, and another end is open in an inner circumferential surface of each of the through-holes which is interposed between the two bearings, and a component suction nozzle lifting and lowering mechanism which causes the plurality of nozzle shafts to move vertically in relation to the nozzle shaft holder, in which, in the bearings, two ring-shaped guide portions which surround an outer circumferential surface of the nozzle shaft to guide the nozzle shaft in the vertical direction are formed separated in the vertical direction, a grease holder which has a larger inner diameter than the ring-shaped guide portion is formed between the two ring-shaped guide portions, and a space which is surrounded by the outer circumferential surface of the nozzle shaft, the two ring-shaped guide portions, and the grease holder is filled with grease.

According to the present disclosure, it is possible to reduce friction which is generated during vertical movement of a nozzle shaft and reduce the size of a placing head while maintaining airtightness between a through-hole of a nozzle shaft holder and the nozzle shaft.

BRIEF DESCRIPTION OF THE DRAWINGS

FIG. 7A is an explanatory diagram of a negative pressure supply path to a component suction nozzle of the placing head with which the component mounter of an exemplary embodiment of the present disclosure is provided; and FIG. 7B is an explanatory diagram of a positive pressure supply path to the same component suction nozzle.

DETAILED DESCRIPTION

Before describing the exemplary embodiment of the present disclosure, a concise description will be given of the problems of the related art. In PTL 1, since the nozzle shaft is supported by an elastic force which is generated by biasing the elastic body, a friction force is generated between the elastic body and the nozzle shaft. Since it is necessary to vertically drive the nozzle shaft against the friction force in order to cause the nozzle shaft to move vertically, there is a problem in that there is a limit to the degree by which the size of a drive motor may be reduced, and it is difficult to reduce the size of the placing head. In a component mounter, the space between an inner circumferential surface of the through-hole and the outer circumferential surface of the nozzle shaft may be used as a flow path for introducing a negative pressure to the nozzle, and there is a problem in that if the elastic body is fitted loosely to the nozzle shaft in order to reduce the friction force, the airtightness of the space may not be maintained, and it becomes difficult to suction hold the component with the tip of the nozzle.

Therefore, an object of the present disclosure is to provide a component mounter capable of reducing friction which is generated during vertical movement of a nozzle shaft and reducing the size of a placing head while maintaining airtightness between a through-hole of a nozzle shaft holder and the nozzle shaft.

Figure 1:
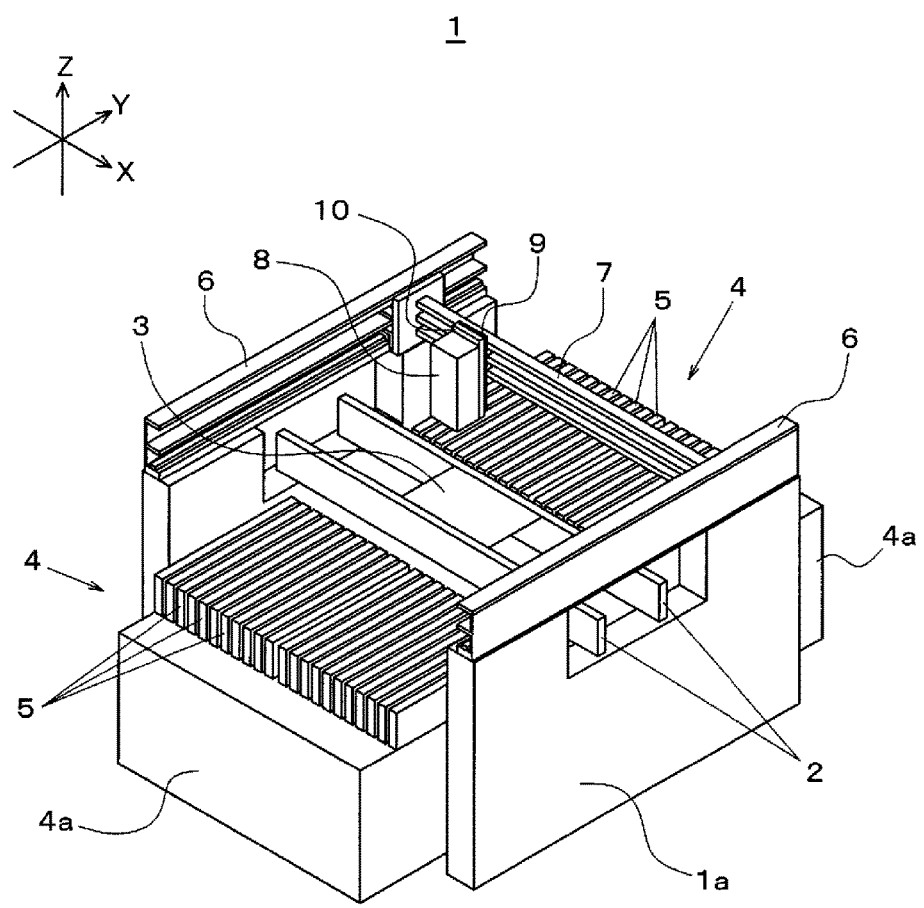
FIG. 1 is a perspective diagram of a component mounter of an exemplary embodiment of the present disclosure.

Next, description will be given of an exemplary embodiment of the present disclosure with reference to the drawings. First, description will be given of the structure of component mounter 1 with reference to FIG. 1. Component mounter 1 includes a function of mounting components onto a board. Hereinafter, a transport direction of the board will be defined as an X direction, a direction perpendicular to the X direction within a horizontal plane will be defined as a Y direction, a direction perpendicular to an XY plane will be defined as a Z direction, and a direction which rotates around the Z direction as an axis inside a horizontal plane will be defined as a Θ direction. In FIG. 1, transport mechanism 2 is arranged in the center of table 1a, where transport mechanism 2 is provided with a pair of transport conveyors extending in the X direction. Transport mechanism 2 receives the component mounting target board 3 from an upstream side device, transports board 3, positions board 3 in a mounting working position of a component placement mechanism (described hereinafter), and holds board 3.

Component supplier 4 is arranged on both sides of transport mechanism 2. Component supplier 4 is configured by arranging a plurality of tape feeders 5 on feeder table 4a. Tape feeder 5 supplies a component (not illustrated) to a pick-up position of placing head 8 of a component mounting mechanism by pitch feeding a carrier tape which stored the components to be mounted onto board 3.

Next, description will be given of the component placement mechanism. Y-axis beams 6 provided with a linear drive mechanism are arranged on an end of table 1a in the X direction, and X-axis beam 7 provided with a linear drive mechanism is installed on Y-axis beams 6 to move freely in the Y direction. Plate member 9 is installed on X-axis beam 7 to move freely in the X direction, and placing head 8 is installed on plate member 9 via holding frame 10. Placing head 8 includes a function of picking up the component to be mounted onto board 3 from component supplier 4 to hold the component. Placing head 8 moves horizontally in the X and Y directions through the driving of Y-axis beams 6 and X-axis beam 7, and mounts the held component onto board 3 which is positioned and held by transport mechanism 2.

Figure 2:
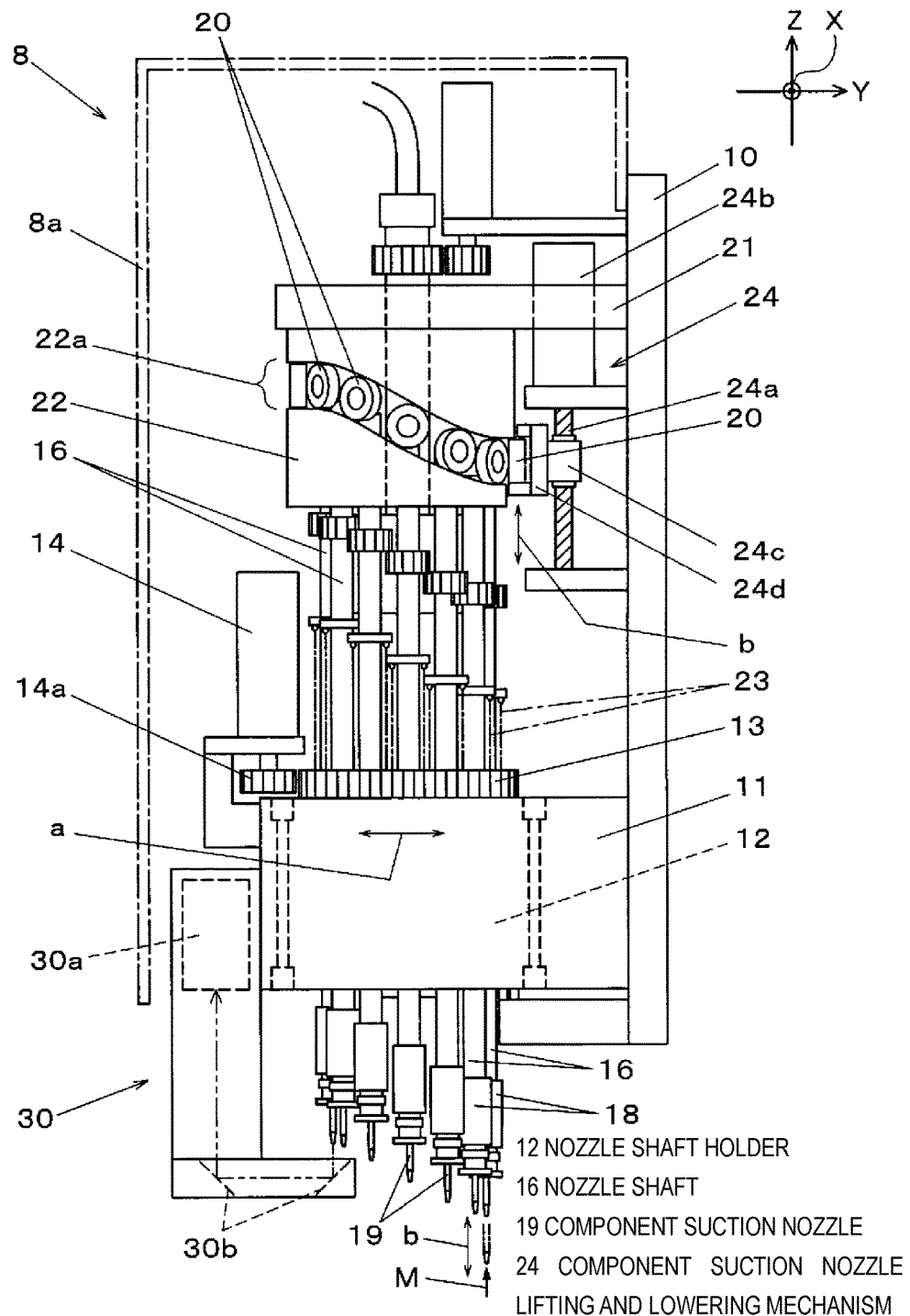
FIG. 2 is a configuration diagram of a placing head with which the component mounter of an exemplary embodiment of the present disclosure is provided.

Next, description will be given of the structure of placing head 8 with reference to FIGS. 2 to 6. In FIG. 2, placing head 8 has a structure in which the side surfaces and the top surface are covered by holding frame 10 and cover 8a which is fixed to holding frame 10. Rotor holder 11 is provided on the bottom of holding frame 10 to protrude in the horizontal direction. In rotor holder 11, nozzle shaft holder 12, which is a columnar rotor, is held to rotate freely around rotational axis CL of the Z direction via bearing 11a (refer to FIG. 3). Holder following gear 13, the axial center of which is rotational axis CL, is fixed to the top surface of nozzle shaft holder 12.

Index drive motor 14 is arranged above rotor holder 11. Index drive gear 14a which meshes with holder following gear 13 is installed in index drive motor 14. Holder following gear 13 undergoes index rotation (arrow a) via index drive gear 14a through the driving of index drive motor 14. Accordingly, nozzle shaft holder 12 also undergoes index rotation together with holder following gear 13.

Figure 4:
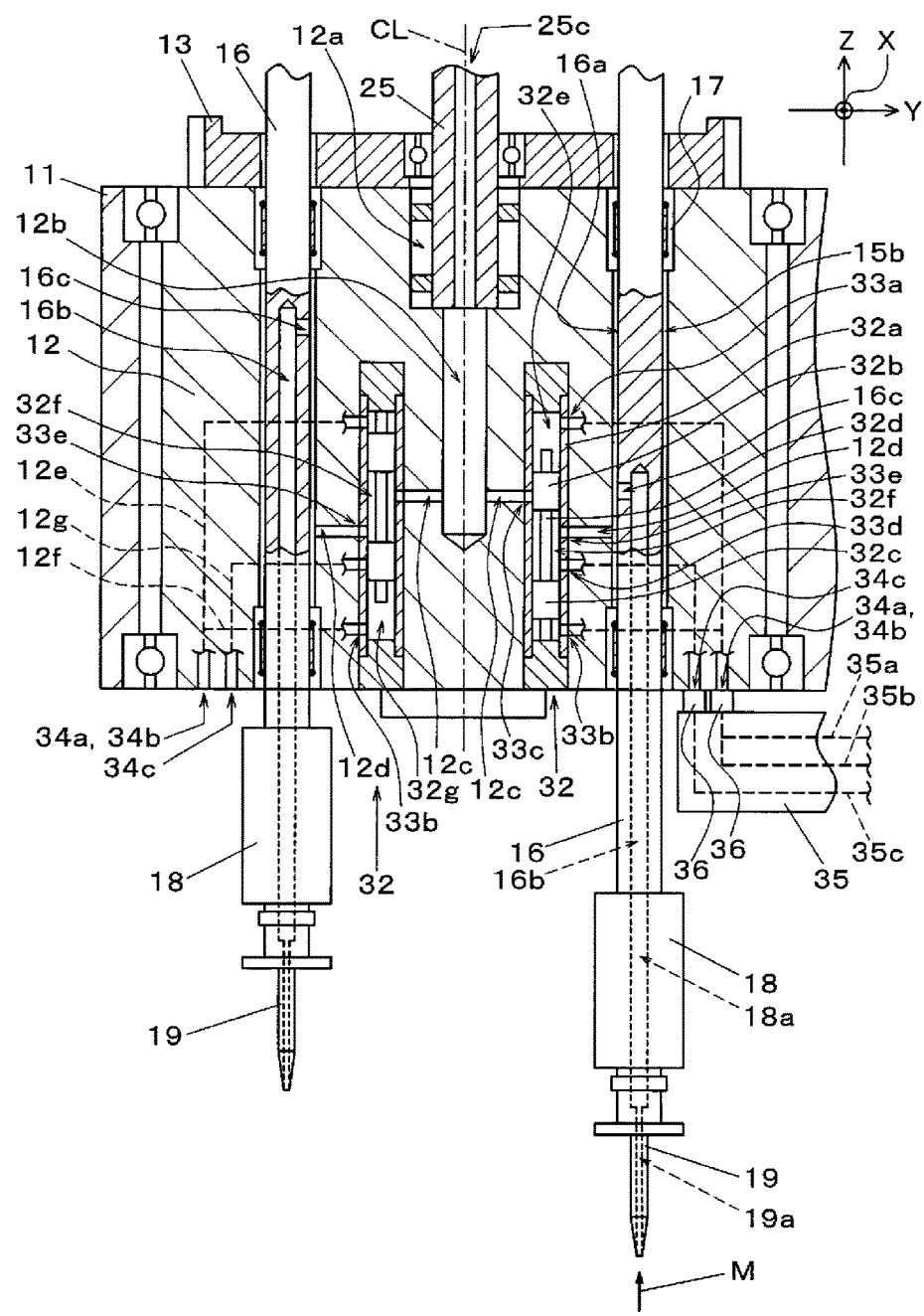
FIG. 4 is a sectional diagram of a portion along a vertical plane of the placing head with which the component mounter of an exemplary embodiment of the present disclosure is provided.
Figure 5:
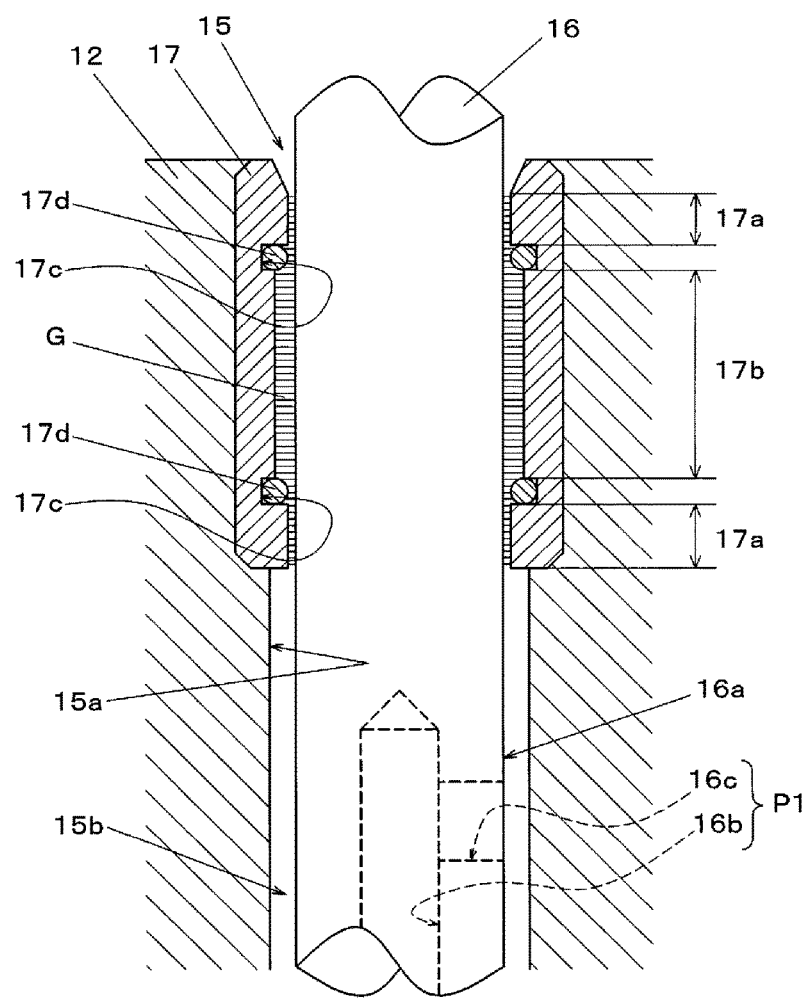
FIG. 5 is a sectional diagram of a bearing portion of the placing head with which the component mounter of an exemplary embodiment of the present disclosure is provided.
Figure 6:
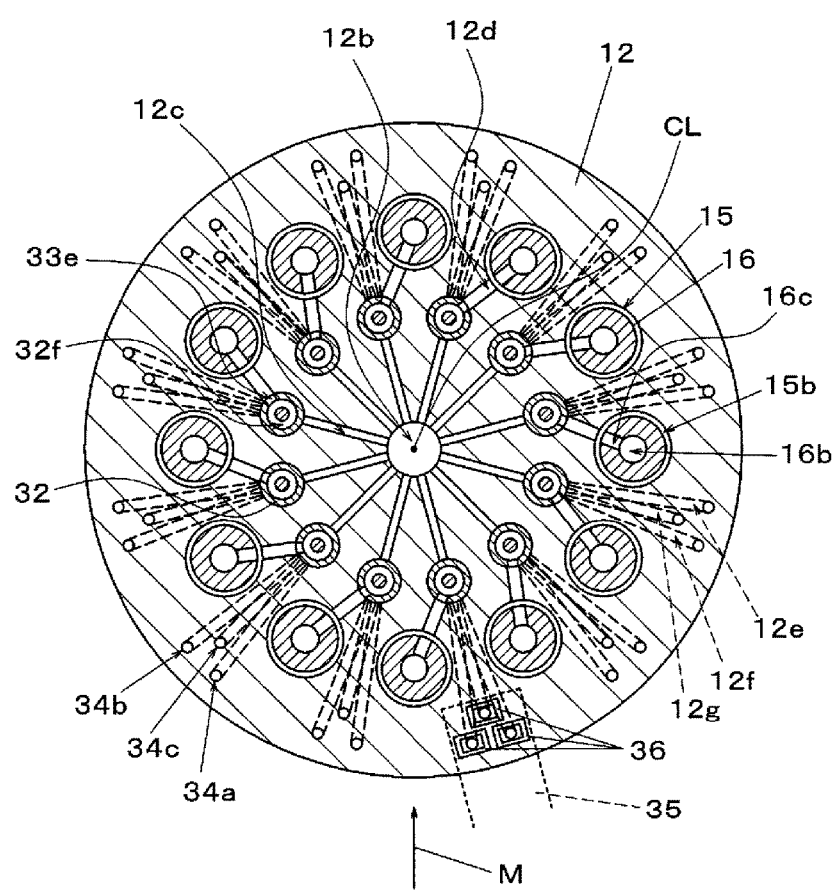
FIG. 6 is a sectional diagram of a portion along a horizontal plane of the placing head with which the component mounter of an exemplary embodiment of the present disclosure is provided.

FIG. 6 schematically illustrates a cross-section taken along a horizontal plane of nozzle shaft holder 12. In FIGS. 3 to 6, a plurality of (here, 12) through-holes 15 which vertically penetrate nozzle shaft holder 12 are provided in positioned on a circular circumference centered on rotational axis CL of nozzle shaft holder 12. Columnar nozzle shaft 16 is inserted into each through-hole 15 to move vertically freely in relation to nozzle shaft holder 12. In other words, nozzle shaft holder 12 includes through-holes 15 into which nozzle shafts 16 are inserted.

Figure 3:
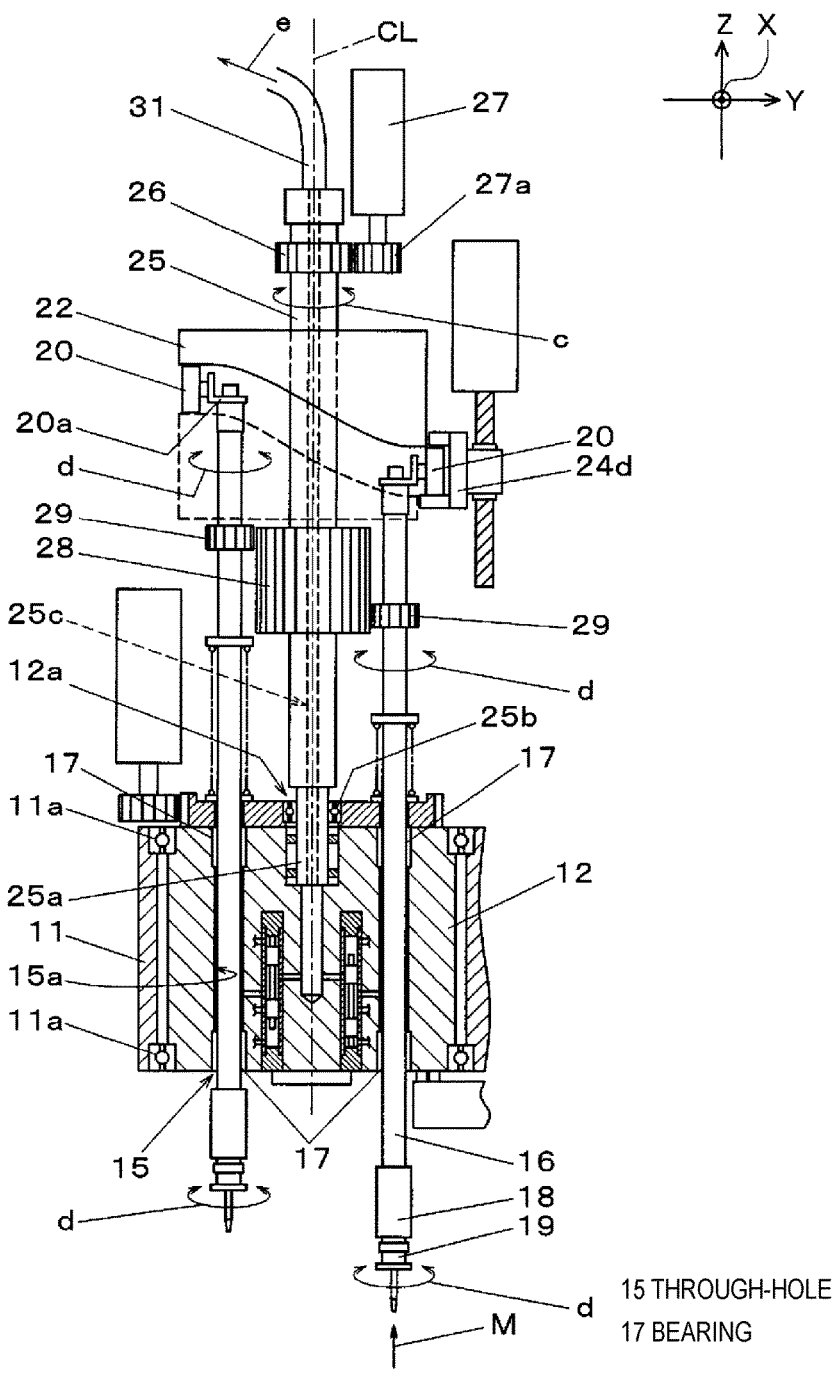
FIG. 3 is a sectional diagram of the placing head with which the component mounter of an exemplary embodiment of the present disclosure is provided.

In FIG. 3, bearings 17 which guide nozzle shaft 16 in the vertical direction are disposed in two locations, vertically separated, of inner circumferential surface 15a of through-hole 15. Nozzle holder 18 is provided on the bottom of each nozzle shaft 16, and component suction nozzle 19 is installed on nozzle holder 18 to detach freely. In other words, component suction nozzle 19 is installed on the bottom end of nozzle shaft 16. Substantially L-shaped fitting 20a is installed on the top end of nozzle shaft 16 to rotate freely in the Θ direction. Cam follower 20 is attached to fitting 20a, where a rotational axis of cam follower 20 having the horizontal direction as an axial center and facing the outside. In other words, cam follower 20 is attached to the top end of nozzle shaft 16.

In FIG. 2, cam holder 21 which fixes cylindrical cam 22 is provided on the top of holding frame 10 to protrude in the horizontal direction. Groove 22a is provided on the outer circumferential surface of cylindrical cam 22. Groove 22a is provided such that the opposite side from holding frame 10 is high and smoothly becomes lower as groove 22a approaches holding frame 10. Cam follower 20 which is attached to each nozzle shaft 16 is installed on cylindrical cam 22 to be capable of moving along groove 22a. Each nozzle shaft 16 is biased upward by elastic body 23 such as a spring which is provided on top of nozzle shaft holder 12. When nozzle shaft holder 12 undergoes index rotation, nozzle shaft 16 moves vertically along groove 22a of cylindrical cam 22 while revolving in the horizontal direction in accordance with the index rotation. A portion of cylindrical cam 22 is removed at the location at which groove 22a is lowest, and groove 22a ends at the removed location.

Component suction nozzle lifting and lowering mechanism 24 is arranged between holding frame 10 and cylindrical cam 22. Component suction nozzle lifting and lowering mechanism 24 is configured to include screw shaft 24a extending in the Z direction, lifting and lowering motor 24b which rotationally drives screw shaft 24a, and nut 24c which screws onto screw shaft 24a. Cam follower holder 24d, which is capable of lifting and lowering movement along the removed location of cylindrical cam 22, is provided on nut 24c. Cam follower holder 24d is lifted and lowered together with nut 24c by the driving of lifting and lowering motor 24b. Cam follower holder 24d has a shape which compliments groove 22a which ends at the removed location. Therefore, cam follower 20 which moves along groove 22a is capable of smoothly transferring to cam follower holder 24d.

Cam follower 20 which moves along groove 22a until this point leaves groove 22a at this position, transfers to cam follower holder 24d which waits at a position of the same height as groove 22a, and is held by cam follower holder 24d. When lifting and lowering motor 24b is driven in this state, nozzle shaft 16 and component suction nozzle 19 are lifted and lowered in relation to nozzle shaft holder 12 together with cam follower 20 (arrow b). In other words, the position of nozzle shaft 16 at which cam follower holder 24d holds cam follower 20 is lifting and lowering position M at which nozzle shaft 16 is lifted and lowered.

In this manner, component suction nozzle lifting and lowering mechanism 24 causes nozzle shaft 16 which is moved to lifting and lowering position M to move vertically in relation to nozzle shaft holder 12. Component suction nozzle lifting and lowering mechanism 24 is not limited to the structure described above, and as long as nozzle shaft 16 is caused to move vertically, component suction nozzle lifting and lowering mechanism 24 may adopt a structure which uses an air cylinder even in the case of a structure which uses a linear motor.

In FIG. 3, attachment hole 12a, which is centered on rotational axis CL of nozzle shaft holder 12, is provided in the top surface of nozzle shaft holder 12. The columnar rotating member 25 which vertically penetrates cylindrical cam 22 is arranged to rotate freely in relation to nozzle shaft holder 12 due to tip 25a of rotating member 25 being fitted into attachment hole 12a via bearing 25b.

Θ rotation follower gear 26, the axial center of which is rotational axis CL, is fixed in the vicinity of the top end of rotating member 25. Θ rotation motor 27 is disposed above cylindrical cam 22, where Θ rotation drive gear 27a which meshes with Θ rotation follower gear 26 is installed on Θ rotation motor 27. Θ rotation follower gear 26 rotates in the Θ direction via Θ rotation drive gear 27a due to the driving of Θ rotation motor 27. Accordingly, rotating member 25 rotates in the Θ direction together with Θ rotation follower gear 26 (arrow c).

Nozzle drive gear 28, which extends lengthily in the vertical direction corresponding to the lifting and lowering stroke of nozzle shaft 16, is fixed between nozzle shaft holder 12 and cylindrical cam 22 in rotating member 25. Nozzle rotation gear 29 is fixed to each nozzle shaft 16 in a position at which nozzle rotation gear 29 meshes with nozzle drive gear 28. All nozzle shafts 16 rotate in the Θ direction at once (arrow d) via nozzle rotation gear 29 through the driving of nozzle drive gear 28. In this manner, nozzle shafts 16 rotate in the Θ direction through the driving of Θ rotation motor 27.

In FIG. 2, component camera unit 30 which images the state of the component held by component suction nozzle 19 from below is provided on rotor holder 11. Component camera unit 30 is configured to include camera 30a which images the component, and mirror 30b which guides the image of the component to camera 30a. During the placement of the component on board 3, mounting positional correction in which nozzle shaft 16 is rotated in the Θ direction, or the like, is performed taking the recognition results of the component by component camera unit 30 into account.

Next, description will be given of an air flow path of placing head 8, with reference to FIGS. 3 to 7B. In FIG. 4, intra-shaft hole 16b, the bottom end of which communicates with component suction nozzle 19, is provided inside nozzle shaft 16. Opening 16c which is opened in a position interposed by two bearings 17 above and below to penetrate to outer circumferential surface 16a of nozzle shaft 16 is provided above intra-shaft hole 16b (also refer to FIG. 5). Opening 16c is positioned within a region which is interposed by two bearings 17 above and below, even if nozzle shaft 16 moves upward or downward.

In FIG. 4, intra-shaft hole 16b communicates with intra-nozzle hole 19a, which provided inside component suction nozzle 19 and is open to the outside at the bottom end, through intra-holder hole 18a which is provided inside nozzle holder 18. In other words, opening 16c and intra-shaft hole 16b are an air flow path which is formed inside nozzle shaft 16. The air flow path forms first flow path P1, one end of which is open at a position of outer circumferential surface 16a of nozzle shaft 16 interposed between two bearings 17, and the other end communicates with component suction nozzle 19 which is mounted to the bottom end of nozzle shaft 16 (also refer to FIG. 5).

In FIG. 4, common flow path 12b, which is opened in the top surface of attachment hole 12a which is provided in the top center of nozzle shaft holder 12, is provided in the vertical direction parallel to rotational axis CL on the inside of nozzle shaft holder 12. Common flow path 12b communicates with intra-rotating member hole 25c which is provided inside rotating member 25 which fits into attachment hole 12a. In FIG. 3, intra-rotating member hole 25c communicates with negative pressure generation source (not illustrated) via tube 31 which is connected to the top end of rotating member 25 (arrow e).

In FIG. 4, valve unit 32 is arranged between common flow path 12b and each through-hole 15 inside nozzle shaft holder 12. Upper piston 32b, lower piston 32c, and rod 32d are disposed inside tube 32a to configure valve unit 32. Tube 32a extends in the vertical direction (the Z direction) and is sealed at the top and bottom, upper piston 32b moves vertically while sliding along the inner wall of tube 32a, lower piston 32c is disposed lower than upper piston 32b, and the two pistons are fixed to rod 32d as though skewered in a vertically separated state.

Three spaces are formed inside tube 32a, an upper space 32e, a middle space 32f, and a lower space 32g. Upper space 32e is formed by the inner wall and ceiling of tube 32a and the top surface of upper piston 32b, middle space 32f is formed by the inner wall of tube 32a, the bottom surface of upper piston 32b, and the top surface of lower piston 32c, and lower space 32g is formed by the inner wall and bottom surface of tube 32a, and the bottom surface of lower piston 32c.

Upper port 33a and lower port 33b to which a positive pressure is supplied and which switch the state of valve unit 32, negative pressure supply port 33c to which a negative pressure is supplied, positive pressure supply port 33d to which a positive pressure is supplied, and outside supply port 33e which supplies the selected negative pressure or positive pressure to the outside are opened in tube 32a. Upper port 33a communicates with upper space 32e. Lower port 33b communicates with lower space 32g.

If a positive pressure is supplied to lower port 33b and rod 32d moves to the highest point, negative pressure supply port 33c communicates with middle space 32f, and positive pressure supply port 33d is closed by lower piston 32c (refer to valve unit 32 of left side of the paper surface in FIG. 4). If a positive pressure is supplied to upper port 33a and rod 32d moves to the lowest point, positive pressure supply port 33d communicates with middle space 32f, and negative pressure supply port 33c is closed by upper piston 32b (refer to valve unit 32 of right side of the paper surface in FIG. 4). Outside supply port 33e always communicates with middle space 32f regardless of the position of rod 32d.

In FIGS. 4 and 6, negative pressure supply port 33c of each valve unit 32 communicates with common flow path 12b via holder lateral hole 12c which is formed inside nozzle shaft holder 12. Outside supply port 33e of each valve unit 32 communicates with communication gap 15b of each through-hole 15 via connecting hole 12d which is formed inside nozzle shaft holder 12. Upper port 33a, lower port 33b, and positive pressure supply port 33d of each valve unit 32 respectively communicate with upper connecting port 34a, lower connecting port 34b, and positive pressure connecting port 34c, which are formed in nozzle shaft holder 12, via upper connecting duct 12e, lower connecting duct 12f, and positive pressure connecting duct 12g, which are formed inside nozzle shaft holder 12.

Upper connecting port 34a, lower connecting port 34b, and positive pressure connecting port 34c of nozzle shaft 16 which is positioned at lifting and lowering position M are respectively connected, via pads 36, to upper supply path 35a, lower supply path 35b, and positive pressure supply path 35c of air supplier 35 which is disposed below nozzle shaft holder 12. Upper supply path 35a, lower supply path 35b, and positive pressure supply path 35c communicate with a positive pressure generation source (not illustrated) via an open-close valve (not illustrated). A positive pressure is supplied to upper supply path 35a, lower supply path 35b, and positive pressure supply path 35c at a predetermined timing by controlling the open-close valve.

Next, description will be given of the detailed structure of bearing 17 with reference to FIG. 5. FIG. 5 is an enlarged diagram of bearing 17 which is provided on the top of through-hole 15 of nozzle shaft holder 12. Bearing 17 which is provided on the bottom of through-hole 15 has the same structure. Bearing 17 is configured to include a plurality of (here, two) ring-shaped guide portions 17a which surround nozzle shaft 16, and a grease holder 17b which has a larger inner diameter than that of each ring-shaped guide portion 17a. Grease holder 17b is interposed between two ring-shaped guide portions 17a from above and below. The inner diameter of the inner circumferential surface of ring-shaped guide portion 17a and the outer diameter of outer circumferential surface 16a of nozzle shaft 16 are machined to dimensions at which the fitting tolerance is appropriate. Accordingly, the inner circumferential surface of ring-shaped guide portion 17a guides the vertical direction movement and the Θ direction rotation of nozzle shaft 16. Grease holder 17b holds grease G, which is a semisolid lubricant.

A space which is surrounded by outer circumferential surface 16a of nozzle shaft 16, two ring-shaped guide portions 17a, and grease holder 17b is filled with grease G. According to grease G with which the space is filled, it is possible to maintain the airtightness of communication gap 15b, which is a space formed by inner circumferential surface 15a of through-hole 15, outer circumferential surface 16a of nozzle shaft 16, and top and bottom bearings 17. Furthermore, according to grease G with which the space is filled, it is possible to reduce the friction which is generated during the vertical movement and during the Θ rotational movement of nozzle shaft 16. Accordingly, it is possible to reduce the drive torque which is necessary for index drive motor 14, lifting and lowering motor 24b, and Θ rotation motor 27 which cause nozzle shaft 16 to move vertically while revolving, and it is possible to reduce the size of each motor.

In this manner, two ring-shaped guide portions 17a, separated in the vertical direction, which surround outer circumferential surface 16a of nozzle shaft 16 to guide nozzle shaft 16 in the vertical direction are formed on bearing 17. Grease holder 17b which has a larger inner diameter than that of ring-shaped guide portion 17a is formed between two ring-shaped guide portions 17a. The space surrounded by outer circumferential surface 16a of nozzle shaft 16, two ring-shaped guide portions 17a, and grease holder 17b is filled with grease G.

Ring-shaped grooves 17c are provided at the boundaries between ring-shaped guide portions 17a and grease holder 17b. Elastic rings 17d such as an O-ring, which is a seal member, are installed in ring-shaped grooves 17c. In other words, elastic rings 17d (the seal members) are installed in the boundaries between ring-shaped guide portions 17a and grease holder 17b. Elastic rings 17d include a function of preventing grease G with which the space is filled from leaking. It is possible to adjust the squeeze in the radial direction of elastic rings 17d (the O-ring) according to the shape of ring-shaped grooves 17c. It is desirable for elastic rings 17d to be installed in a state in which the squeeze in the radial direction is within a range from 0% (that is, a state in which elastic rings 17d are not compressed) to 5%, inclusive. Accordingly, it is possible to prevent leaking of grease G while suppressing the friction which is generated between elastic rings 17d and nozzle shaft 16.

Next, description will be given of the negative pressure and positive pressure supply paths and the supply method, where the pressures are supplied to component suction nozzle 19 which is installed on nozzle shaft 16 which is positioned at lifting and lowering position M, with reference to FIGS. 7A and 7B. First, description will be given of the supply of a negative pressure with reference to FIG. 7A. When supplying a negative pressure, a positive pressure is supplied from the positive pressure generation source to lower port 33b of valve unit 32 (arrow f). Accordingly, upper piston 32b, lower piston 32c, and rod 32d move upward in valve unit 32 (arrow g), and positive pressure supply port 33d is closed by lower piston 32c. In accordance with this movement, negative pressure supply port 33c, which is closed until this point by upper piston 32b, opens, and valve unit 32 enters a "negative pressure supplying state".

When valve unit 32 enters the "negative pressure supplying state", common flow path 12b, holder lateral hole 12c, negative pressure supply port 33c, middle space 32f, outside supply port 33e, connecting hole 12d, communication gap 15b, opening 16c, and intra-shaft hole 16b communicate with each other. The air flow path which is formed in this manner is subjected to vacuum suction (arrow h) by the negative pressure generation source which communicates with common flow path 12b. Accordingly, the component is sucked and held by component suction nozzle 19. In other words, component mounter 1 is provided with component suction nozzle 19 which holds the component using a suction force which is generated by the negative pressure generation source.

In this manner, common flow path 12b, holder lateral hole 12c, negative pressure supply port 33c, middle space 32f, outside supply port 33e, and connecting hole 12d are an air flow path which is formed inside nozzle shaft holder 12, and the air flow path is second flow path P2 which is open at a position (communication gap 15b) interposed between two bearings 17. One end of second flow path P2 communicates with negative pressure generation source, and the other end is inner circumferential surface 15a of through-hole 15.

Next, description will be given of the supply of a positive pressure with reference to FIG. 7B. When supplying a positive pressure, a positive pressure is supplied from the positive pressure generation source to upper port 33a of valve unit 32 (arrow j). Accordingly, upper piston 32b, lower piston 32c, and rod 32d move downward in valve unit 32 (arrow k), and negative pressure supply port 33c is closed by upper piston 32b. In accordance with this movement, positive pressure supply port 33d, which is closed until this point by lower piston 32c, opens, and valve unit 32 enters a "positive pressure supplying state".

When valve unit 32 enters the "positive pressure supplying state", positive pressure supply port 33d, middle space 32f, outside supply port 33e, connecting hole 12d, communication gap 15b, opening 16c, and intra-shaft hole 16b communicate with each other. the positive pressure (air) is supplied to the air flow path which is formed in this manner by the positive pressure generation source which communicates with positive pressure supply port 33d (arrow m). Accordingly, the vacuum suction state of component suction nozzle 19 is destroyed (arrow n), and the component, which is held by component suction nozzle 19 until this point, is placed on the board.

Valve unit 32 is configured to maintain the "negative pressure supplying state" or the "positive pressure supplying state", even if the supply of positive pressure to lower port 33b or upper port 33a is stopped. Therefore, nozzle shaft 16, in which valve unit 32 enters the "negative pressure supplying state" at lifting and lowering position M and component suction nozzle 19 sucks the component, is capable of continually holding the component with the vacuum state maintained, even if nozzle shaft holder 12 performs index rotation and leaves lifting and lowering position M. Nozzle shaft 16, in which valve unit 32 enters the "positive pressure supplying state" at lifting and lowering position M and the component separates from component suction nozzle 19, maintains a state in which the path communicating with the negative pressure generation source is blocked, even if nozzle shaft holder 12 performs index rotation and leaves lifting and lowering position M.

As described above, component mounter 1 of the present exemplary embodiment is provided with nozzle shaft holder 12 which includes through-hole 15 into which nozzle shaft 16, component suction nozzle 19 being installed on the bottom end thereof, is inserted, and bearings 17 which are disposed in two locations separated vertically on inner circumferential surface 15a of through-hole 15 and which guide nozzle shaft 16 in the vertical direction. Two ring-shaped guide portions 17a, which surround outer circumferential surface 16a of nozzle shaft 16 to guide nozzle shaft 16 in the vertical direction, are formed in bearing 17 separated in the vertical direction. Grease holder 17b, which has a larger inner diameter than ring-shaped guide portion 17a, is formed between two ring-shaped guide portions 17a, and the space surrounded by outer circumferential surface 16a of nozzle shaft 16, two ring-shaped guide portions 17a, and grease holder 17b is filled with grease G.

Accordingly, It is possible to reduce the friction which is generated during vertical movement of nozzle shaft 16 and during rotation in the Θ direction while maintaining airtightness between through-hole 15 of nozzle shaft holder 12 and nozzle shaft 16. Therefore, it is possible to reduce the size of index drive motor 14 which causes Θ rotation motor 27 and nozzle shaft holder 12 to perform index rotation, and it is possible to reduce the size of the placing head. Θ rotation motor 27 and nozzle shaft holder 12 cause lifting and lowering motor 24b and nozzle shaft 16 to rotate in the Θ direction, and lifting and lowering motor 24b and nozzle shaft 16 cause nozzle shaft 16 to move vertically at lifting and lowering position M.

The component mounter of the present disclosure has the effect of being capable of reducing friction which is generated during vertical movement of a nozzle shaft and reducing the size of a placing head while maintaining airtightness between a through-hole of a nozzle shaft holder and the nozzle shaft. The component mounter is effective in the field of component mounting in which components are mounted onto a board.

What is claimed is:

1. A component mounter provided with a component suction nozzle which uses a suction force which is generated by a negative pressure generation source to hold a component, the component mounter comprising:
   a nozzle shaft, on a bottom end of which the component suction nozzle is installed;
   a nozzle shaft holder which includes a through-hole into which the nozzle shaft is inserted;
   two bearings which are disposed in two locations separated vertically on an inner circumferential surface of the through-hole and which guide the nozzle shaft in a vertical direction;
   a first flow path which is an air flow path formed inside the nozzle shaft, one end of the first flow path is an outer circumferential surface of the nozzle shaft and is open at a position interposed by the two bearings, and another end communicates with the component suction nozzle which is installed on a bottom end of the nozzle shaft;
   a second flow path which is an air flow path formed inside the nozzle shaft holder, one end of the second flow path communicates with the negative pressure generation source, and another end is an inner circumferential surface of the through-hole and is open at a position which is interposed between the two bearings; and
   a component suction nozzle lifting and lowering motor which causes the nozzle shaft to move vertically in relation to the nozzle shaft holder,
   wherein, in each of the bearings:
      two ring-shaped guide portions which surround an outer circumferential surface of the nozzle shaft to guide the nozzle shaft in the vertical direction are formed separated in the vertical direction, a grease holder which has a larger inner diameter than the ring-shaped guide portion is formed between the two ring-shaped guide portions,
a space is surrounded by the outer circumferential surface of the nozzle shaft, the two ring-shaped guide portions, and the grease holder, and
the space is filled with grease.

2. The component mounter of claim 1,
wherein seal members are installed at borders between the ring-shaped guide portions and the grease holder.

3. The component mounter of claim 2,
wherein the seal members are elastic rings, and the seal members are installed in a state in which a squeeze in a radial direction is within a range from 0% to 5%, inclusive.

4. A component mounter provided with a component suction nozzle which uses a suction force which is generated by a negative pressure generation source to hold a component, the component mounter comprising:
a plurality of nozzle shafts, on a bottom end of each of which the component suction nozzle is installed;
a nozzle shaft holder which includes a plurality of through-holes and holds the nozzle shafts in a state in which one nozzle shaft is inserted into each of the through-holes;
two bearings which are disposed in two locations separated vertically on an inner circumferential surface of the through-hole and which guide the nozzle shaft in a vertical direction;
first flow paths which are air flow paths formed inside each of the nozzle shafts, one end of the first flow path is an outer circumferential surface of the nozzle shaft and is open at a position interposed by the two bearings, and another end communicates with the component suction nozzle which is installed on a bottom end of the nozzle shaft;
a second flow path which is an air flow path formed inside the nozzle shaft holder, one end of the second flow path communicates with the negative pressure generation source, and another end is open in an inner circumferential surface of each of the through-holes which is interposed between the two bearings; and
a component suction nozzle lifting and lowering motor which causes the plurality of nozzle shafts to move vertically in relation to the nozzle shaft holder,
wherein, in each of the bearings:
two ring-shaped guide portions which surround an outer circumferential surface of the nozzle shaft to guide the nozzle shaft in the vertical direction are formed separated in the vertical direction,
a grease holder which has a larger inner diameter than the ring-shaped guide portion is formed between the two ring-shaped guide portions,
a space is surrounded by the outer circumferential surface of the nozzle shaft, the two ring-shaped guide portions, and the grease holder, and
the space is filled with grease.

5. The component mounter of claim 4,
wherein seal members are installed at borders between the ring-shaped guide portions and the grease holder.

6. The component mounter of claim 5,
wherein the seal members are elastic rings, and the seal members are installed in a state in which a squeeze in a radial direction is within a range from 0% to 5%, inclusive.

* * * * *